United States Patent [19]

Sekiguchi

[11] Patent Number: 5,051,682
[45] Date of Patent: Sep. 24, 1991

[54] SYSTEM FOR DETECTING LOAD ON GENERATOR

[75] Inventor: Akira Sekiguchi, Higashimatsuyama, Japan

[73] Assignee: Diesel Kiki Co., Ltd., Tokyo, Japan

[21] Appl. No.: 429,074

[22] Filed: Oct. 30, 1989

[30] Foreign Application Priority Data

Nov. 7, 1988 [JP] Japan .................. 63-280923

[51] Int. Cl.$^5$ .................. H02K 11/00; H02P 9/00; G01R 19/04
[52] U.S. Cl. .................. 322/99; 322/38; 324/158 MG; 328/151
[58] Field of Search .............. 322/7, 99, 38; 328/151; 324/158 MG

[56] References Cited

U.S. PATENT DOCUMENTS

| 4,073,009 | 2/1978 | Andow | 328/151 X |
| 4,121,119 | 10/1978 | Meigs et al. | 328/151 X |
| 4,749,944 | 6/1988 | Okamoto | 324/158 MG |
| 4,866,301 | 9/1989 | Smith | 328/151 X |

FOREIGN PATENT DOCUMENTS 58-7072 2/1983 Japan .
61-135396 6/1986 Japan .

Primary Examiner—R. J. Hickey

[57] ABSTRACT

A peak hold circuit and a sample-and-hold circuit are provided for accurately and immediately detecting variations in a load connected to a generator. The peak hold circuit holds a peak voltage of a waveform voltage signal having an amplitude corresponding to the magnitude of the load. The peak hold circuit is responsive to a reset signal from a reset circuit to be reset during a time interval between a point after the peak of the waveform voltage signal and a point before a subsequent peak of the waveform voltage signal, so that the peak hold circuit is reset, thereby renewing the peak voltage held in the peak hold circuit. When the sample-and-hold circuit receives a sampling instruction signal from a sampling instruction circuit during a time interval between a point after the peak of said waveform voltage signal and a point before said reset signal is outputted, the sample-and-hold circuit operates in a sampling mode to sample the peak voltages outputted from the peak hold circuit. The sample-and-hold circuit is switched into a hold mode before the peak hold circuit is reset, so as to hold the sampled peak voltage.

9 Claims, 6 Drawing Sheets

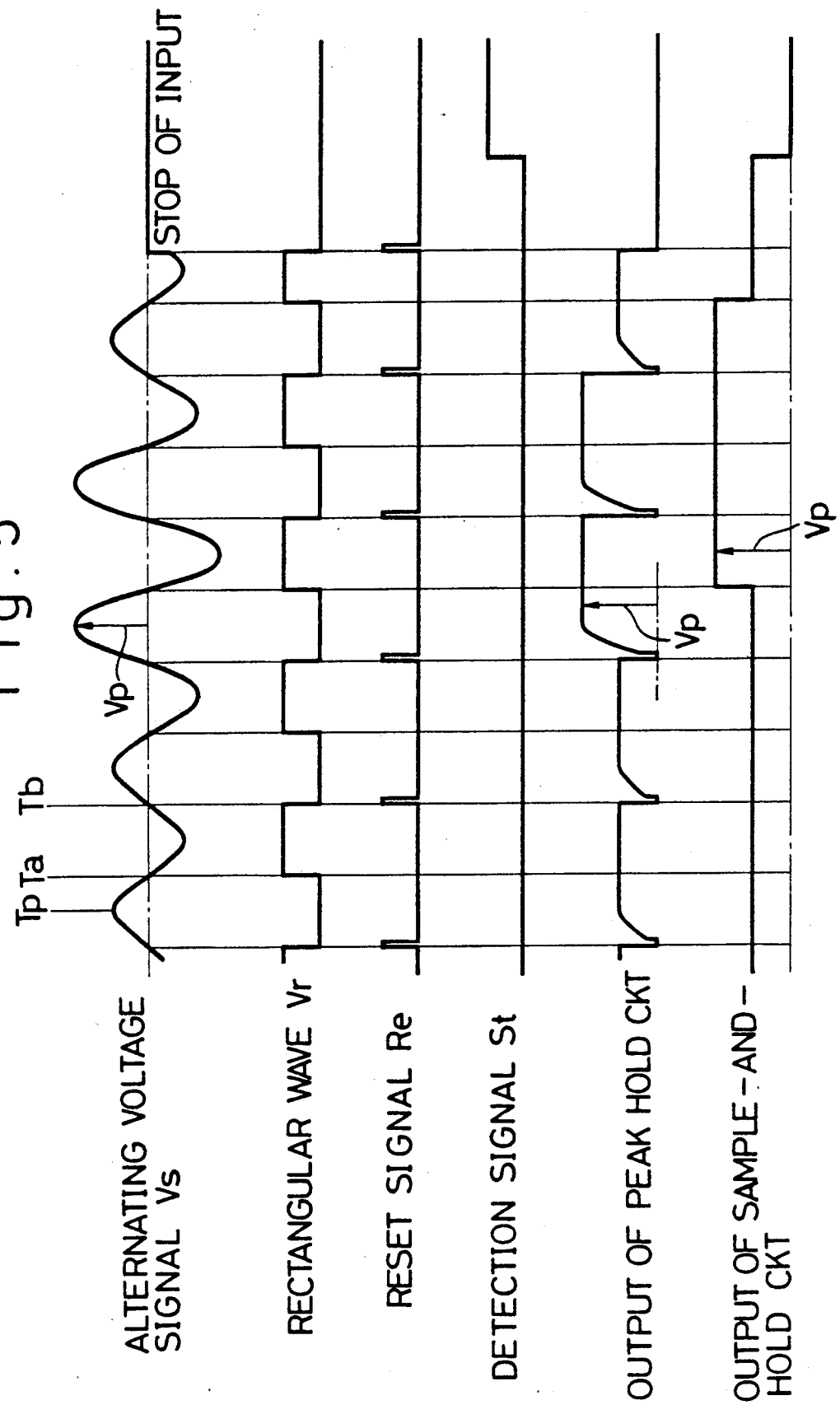

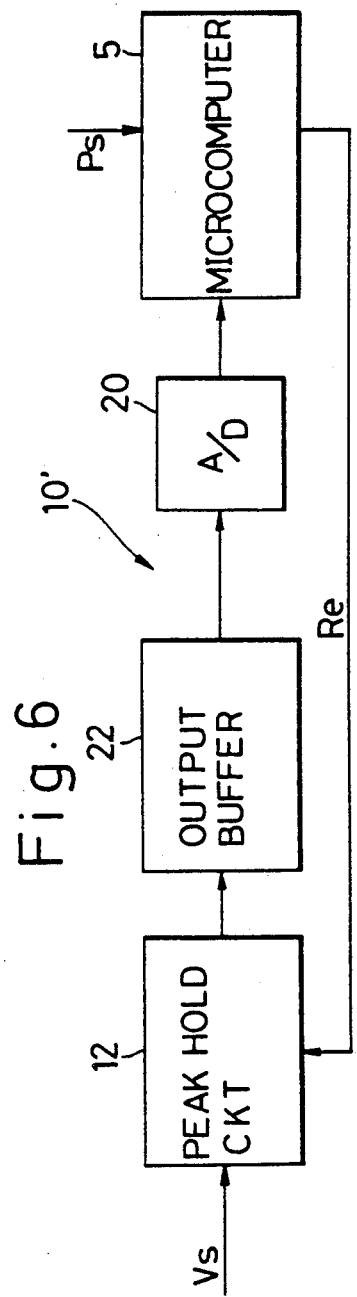
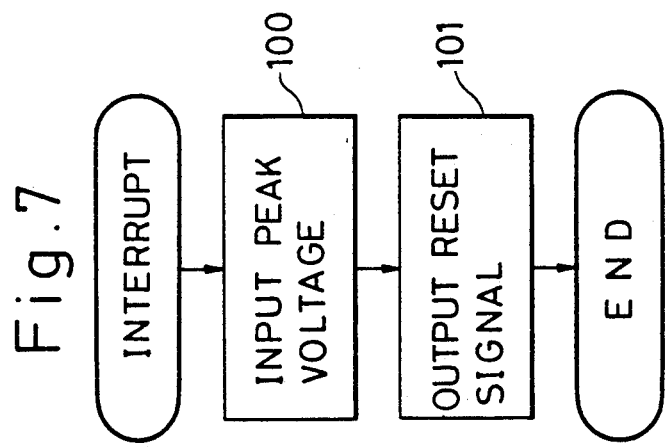

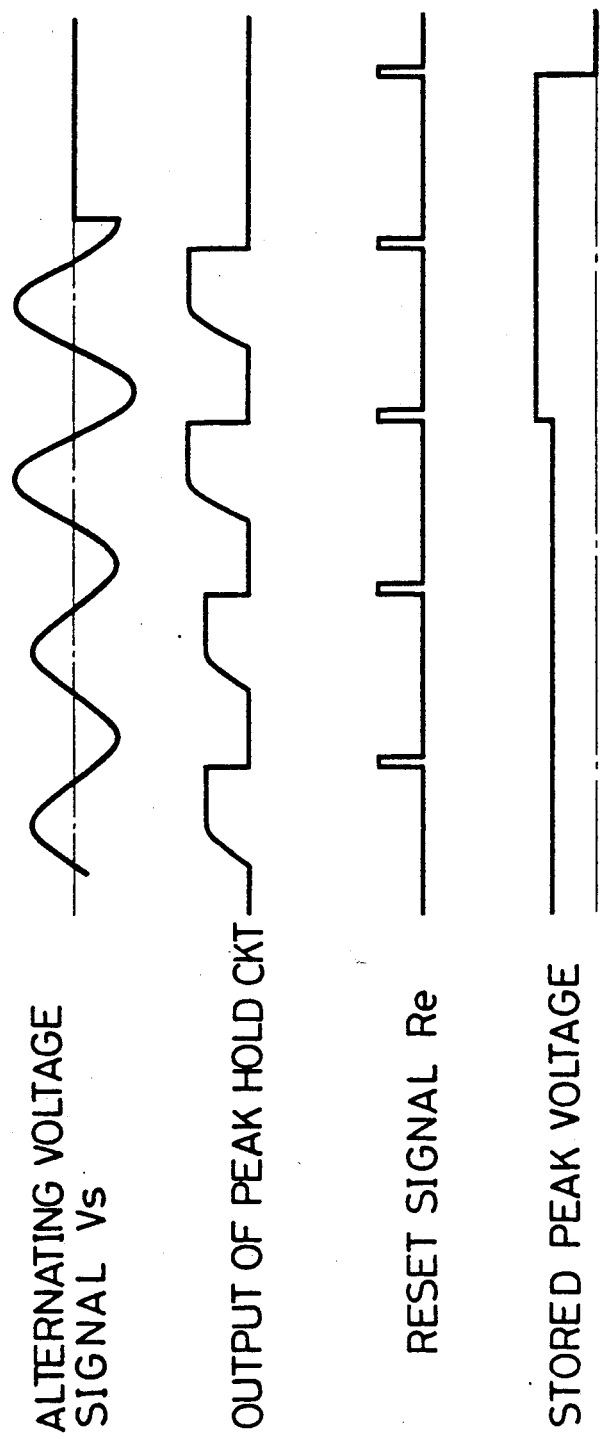

SYSTEM FOR DETECTING LOAD ON GENERATOR

BACKGROUND OF THE INVENTION

1. Field of the Invention

This invention relates to a system for detecting a load on a generator.

2. Prior Art

An electricity generating system comprises an engine such as a diesel engine, and a generator connected to the engine. In such an electricity generating system, it is necessary that the frequency of the output of the generator be kept at a predetermined level even when the load connected to the generator varies in magnitude or value.

In one conventional electricity generating system as disclosed in Japanese Utility Model Publication No. 7072/83, the speed of rotation of a generator is detected, and such a detected signal is fed back to a fuel supply control circuit to control the amount of fuel supply to an engine so that the speed of rotation of the generator can coincide with a preselected speed. With this arrangement, when the output frequency of the generator temporarily varies with a variation in the load, the output frequency is returned to a predetermined level. However, this is not sufficient to prevent a variation of the output frequency of the generator which occurs instantaneously immediately after the load varies. For this reason, the system of the above Japanese utility model publication is provided with a device for directly detecting the value of the load.

In this conventional load detecting device, an alternating (ac) voltage signal is obtained from an alternating current (which passes through the load) through a current transformer and a resistor, and this alternating voltage signal is rectified by a rectifier and is smoothed by a ripple filter to produce a dc voltage signal corresponding to the value of the load. In addition to the above detection signal representative of the rotational speed of the generator, this dc voltage signal is also fed back to the fuel supply control circuit to control the amount of fuel supply to the engine in order to prevent an instantaneous variation of the output frequency of the generator which occurs immediately after the load varies in value.

In the above load detecting device, however, since the alternating voltage signal is smoothed by the ripple filter, the variation of the dc voltage signal corresponding to the variation in the load appears considerably after the load is subjected to such a variation. Such time delay can not be disregarded. Thus, it has been difficult to restrain the instantaneous variation of the above output frequency to a satisfactory level.

In an attempt to overcome this difficulty, a load detecting device has been proposed in Japanese Laid-Open (Kokai) Patent Application No. 135396/86. More specifically, an alternating voltage signal is obtained as in the device of the above Japanese utility model publication. The alternating voltage signal is rectified by a full-wave rectifier circuit so as to produce a waveform voltage signal. This conventional device further comprises a sample-and-hold circuit and a rotation detecting device serving as a sampling instruction means. The rotation detecting device outputs pulses in accordance with the rotation of an engine. The pulse is outputted each time the waveform voltage signal is at its peak. These pulses outputted during such a short time period serve as a sampling instruction signal. The sample-and-hold circuit is responsive to the sampling instruction signal to effect the sampling of the peak voltage of the waveform voltage signal and to hold it. The thus obtained peak voltage is fed back as a signal representative of the value of the load.

With this conventional load detecting device, the peak voltage of the waveform voltage signal is detected without using a ripple filter, and therefore variations in the load can be detected without undue delay. Thus, the instantaneous variation of the output frequency of the generator can be restrained theoretically.

In the load detecting device of the above Japanese Laid-Open Patent Application No. 135396/86, the rotation detecting device is required t be connected to the output shaft of the engine with high precision so that the sampling instruction signal can be outputted at the time when the waveform voltage signal is at its peak. However, this is rather difficult. Therefore, actually, the timing of outputting the sampling instruction signal does not coincide with the time when the waveform voltage signal is at its peak. As a result, the variation in the load could not be accurately detected, thus failing to positively restrain the instantaneous variation in the output frequency of the generator.

SUMMARY OF THE INVENTION

It is therefore an object of this invention to provide a load detecting system which can detect the load accurately and can detect variations in the load with almost no time delay.

According to the present invention, there is provided a system for detecting a load on a generator, comprising:

(a) means for generating a waveform voltage signal from a alternating current passing through the load connected to the generator, the waveform voltage signal corresponding to the magnitude of the load;

(b) peak hold means for detecting a peak voltage of the waveform voltage signal and for holding the peak voltage;

(c) reset means for outputting a reset signal to the peak hold means to reset the same during a time period between a point after the peak of the waveform voltage signal and a point before a subsequent peak of the waveform voltage signal;

(d) sampling instruction means for outputting a sampling instruction signal during a time period between the point after the peak of the waveform voltage signal and a point before the peak hold means is reset by the reset signal; and (e) sample-and-hold means responsive to the sampling instruction signal so as to operate in a sampling mode to sample the peak voltage outputted from the peak hold means, the sample-and-hold means being kept in a hold mode to hold the sampled peak voltage when the sampling instruction signal ceases to be fed to the sample-and-hold means.

BRIEF DESCRIPTION OF THE DRAWINGS

FIG. 5 is a time chart showing the operation of the load detecting system;

FIG. 6 is a block diagram of an important portion of a modified load detecting system;

FIG. 7 is a flow chart of an interrupt routine executed by a microcomputer of the load detecting system of FIG. 6; and FIG. 8 is a time chart showing the operation of the load detecting system of FIG. 6.

DESCRIPTION OF THE PREFERRED EMBODIMENTS OF THE INVENTION

One preferred embodiment of the invention will now be described with reference to FIGS. 1 to 5.

Figure 1:
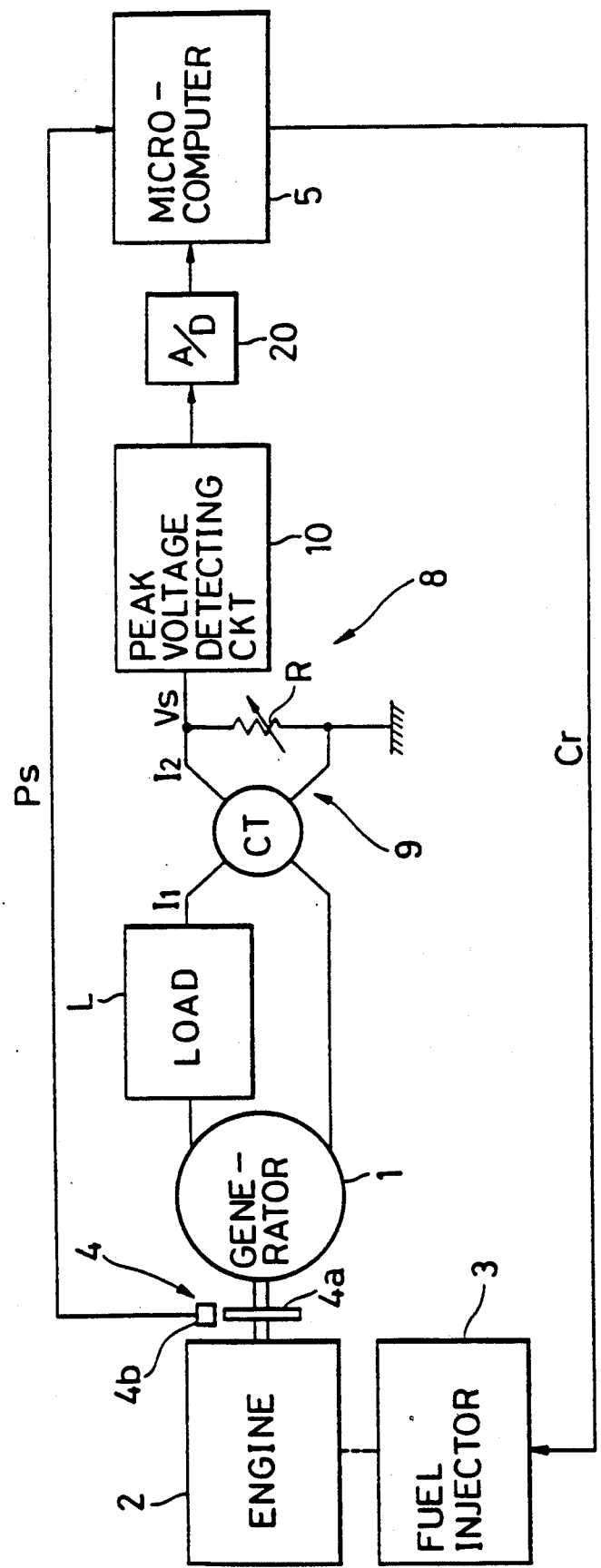
FIG. 1 is a block diagram of an electricity generating system incorporating a load detecting system according to the present invention.

FIG. 1 shows an electricity generating system which comprises a generator 1, a diesel engine 2 connected to the generator 1 so as to transmit its rotation to the generator 1, and a fuel injector 3 for supplying fuel to the diesel engine 2. The fuel injector 3 includes a regulator member (not shown) for adjusting the amount of injection of the fuel, and an electronically-controlled governor (not shown) for controlling the position of the regulator member. A load L is connected to the generator 1 and is supplied with electric power from the generator 1.

The electricity generating system also comprises a rotation detecting device 4, and a microcomputer 5. The rotation detecting device 4 detects the rotation of the engine 2 and hence the rotation of the generator 1. More specifically, for example, the rotation detecting device 4 comprises a pulser 4a having a plurality of cogs (not shown) on an outer periphery thereof and fixedly mounted on the output shaft of the engine 2 for rotation therewith, and an electromagnetic pickup 4b disposed in the vicinity of the outer periphery of the pulser 4a. The electromagnetic pickup 4b generates one or more pulse signals Ps per rotation of the engine 1. This pulse signal Ps is shaped into a rectangular wave by a waveform shaping circuit (not shown), and the rectangular wave is fed to the microcomputer 5. Basically, the microcomputer 5 is responsive to the pulse signal Ps from the rotation detecting device 4 to detect or compute the speed of rotation of the engine 2, and outputs a control signal Cr in accordance with a deviation of this detected rotational speed from a preselected rotational speed so that the rotational speed of the engine 2 can coincide with the preselected rotational speed. The governor of the fuel injector 3 is responsive to the control signal Cr to control the position of the regulator member, thereby adjusting the amount of injection of the fuel into the engine 2. Thus, basically, the frequency of the output of the generator 1 can be rendered at a predetermined level.

According to an important aspect of the invention, the electricity generating system further comprises a load detecting system 8. The load detecting system 8 is designed to directly detect the magnitude or value of the load L and to feed a load information, representative of such load value, back to the microcomputer 5. The microcomputer 5 produces the control signal Cr in accordance with both this load information and the information representative of the rotational speed of the engine 2, thereby restraining a variation of the output frequency of the generator 1 occurring in accordance with a variation in the load L. The load detecting system 8 comprises a waveform voltage signal generating circuit 9, and a peak voltage detecting circuit 10.

The waveform voltage signal generating circuit 9 comprises a current transformer CT and a variable resistor R. The primary winding of the current transformer CT is connected in series with the load L, and the variable resistor R is connected to the secondary winding of the current transformer CT. An alternating current signal $I_2$ flows through the secondary winding of the current transformer CT. The alternating current signal $I_2$ is proportional in amplitude to an alternating current $I_1$ flowing through the load L, but is much smaller in value than the alternating current $I_1$. An alternating voltage signal (waveform voltage signal) Vs of a sine wave is produced across the variable resistor R, the amplitude of the alternating voltage signal Vs being proportional to the amplitude of the alternating current signal $I_2$ and hence to the magnitude of the load L.

One end or terminal of the variable resistor R is grounded, and the alternating voltage signal Vs appearing at the other end of the variable resistor R is fed to the peak voltage detecting circuit 10.

Figure 2:
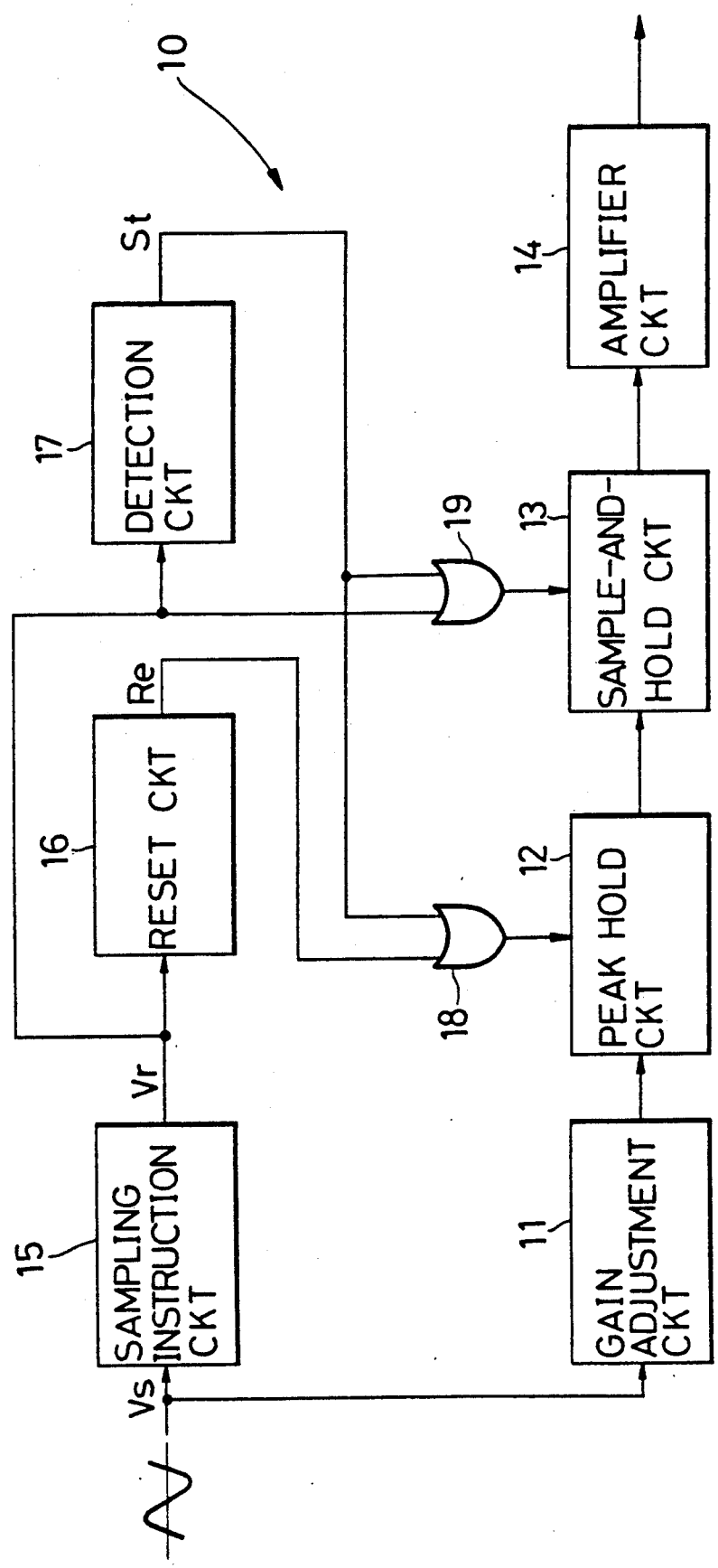
FIG. 2 is a block diagram of a peak voltage detecting circuit of the load detecting system.
Figure 3:
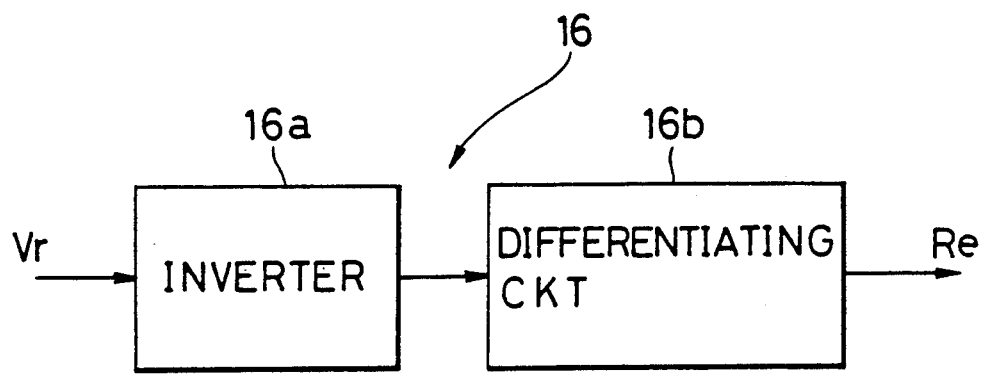
FIG. 3 is a block diagram of a reset circuit of the peak voltage detecting circuit.
Figure 4:
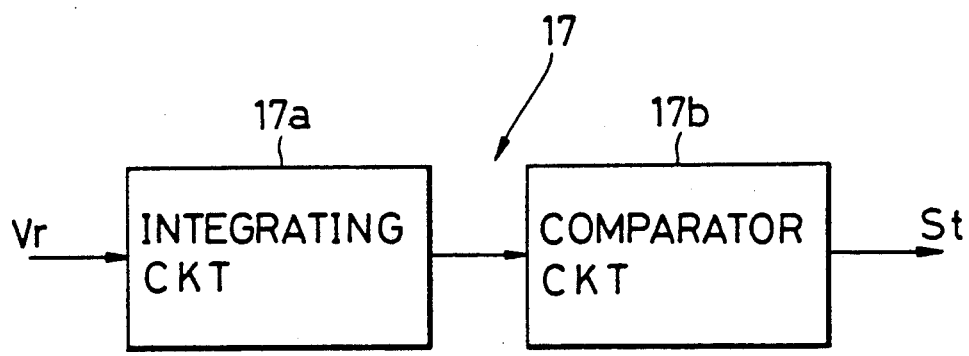
FIG. 4 is a block diagram of a detection circuit of the peak voltage detecting circuit.

As shown in FIG. 2, the peak voltage detecting circuit 10 comprises a gain adjustment circuit 11, a peak hold circuit 12, a sample-and-hold circuit 13, an amplifier circuit 14, a sampling instruction circuit 1 for the sample-and-hold circuit 13, a reset circuit 16 for the peak hold circuit 12, a detection circuit 17 for detecting the stop of the inputting of the alternating voltage signal Vs, and two OR circuits 18 and 19. The sampling instruction circuit 15 comprises a waveform shaping circuit. The reset circuit 16 comprises an inverter 16a and a differentiating circuit 16b, as shown in FIG. 3. The detection circuit 17 comprises an integrating circuit 17a composed of a resistor and a capacitor, and a comparator circuit 17b, as shown in FIG. 4.

The operation of the peak voltage detecting circuit 10 of the above construction will now be described in detail with reference to a time chart of FIG. 5. The alternating voltage signal Vs is inputted into the sampling instruction circuit 15 where the alternating voltage signal Vs is shaped into a rectangular wave Vr. The rectangular wave Vr goes high at substantially the points where the sine wave of the alternating voltage signal Vs, when going low, crosses the zero axis, and the rectangular wave Vr goes low at substantially the points where the sine wave of the alternating voltage signal Vs, when going high, crosses the zero axis. Therefore, the rectangular wave Vr is at a high level during the time period when the alternating voltage signal Vs is negative, and the rectangular wave Vr is at a low level (zero volt) during the time period when the alternating voltage signal Vs is positive. The high level portions of the rectangular wave Vr are used as a sampling instruction signal. Therefore, time Ta of the start of this sampling instruction signal and time Tb of the stop of the sampling instruction signal are determined as follows: The time interval between time Tp of the peak of the alternating voltage signal Vs and the time Ta of the start of the sampling instruction signal corresponds to one-fourth (¼) of the cycle of the alternating voltage signal Vs. The time interval between the peak time Tp and the time Tb of the stop of the sampling instruction signal corresponds to three-fourths (¾) of the cycle of the alternating voltage signal Vs. Therefore, the time period during which the sampling instruction signal is outputted corresponds to a half of the cycle of the alternating voltage signal Vs.

The rectangular wave Vr is also fed to the reset circuit 16 where the rectangular wave Vr is inverted by the inverter 16a and then is differentiated by the differentiating circuit 16b. Thus, the differentiation output of a high level is fed from the differentiating circuit 16 immediately after the trailing edge of the rectangular wave Vr. This differentiation output is used as a reset signal Re. Therefore, the reset signal Re is outputted from the reset circuit 16 immediately after the time Tb of the stop of the sampling instruction signal, that is, with a very small delay from the time Tb.

The rectangular wave Vr is also fed to the detection circuit 17 where the rectangular wave Vr is integrated by the integrating circuit 17a and then is compared with a reference level by the comparator circuit 17b. When the integration output of the integrating circuit 17a goes below this reference level, the comparator circuit 17b outputs a detection signal St of a high level. Therefore, when the alternating voltage signal Vs ceases to be inputted into the peak voltage detecting circuit 10, the detection signal St is outputted with a time delay determined by the time constant of the integrating circuit 17a. The detection signal St of a high level is used as the reset signal for the peak hold circuit 12 and is also used as the sampling instruction signal for the sample-and-hold circuit 13.

The alternating voltage signal Vs is also fed to the gain adjustment circuit 11 where the amplitude of the alternating voltage signal Vs is increased or decreased in accordance with a predetermined gain. For better understanding of the invention, it is assumed in the description below that the gain is "1". The alternating voltage signal Vs of which gain is thus adjusted is outputted from the gain adjustment circuit 11 and is fed to the peak hold circuit 12.

As described above, the reset signal Re is outputted from the reset circuit 16 immediately after three fourths (4/3) of the cycle from the time Tp of the peak of the alternating voltage signal Vs, that is, immediately after the sine wave of the alternating voltage signal Vs, when going high, crosses the zero axis. The reset signal Re is fed to the peak hold circuit 12 via the OR circuit 18, so that the peak hold circuit 12 is reset. As a result, the output of the peak hold circuit 12 becomes zero volt, and immediately after the resetting of the peak hold circuit 12, the peak value of the alternating voltage signal Vs is detected. At the time of the resetting of the peak hold circuit 12, the alternating voltage signal Vs in the process of going high, and therefore the detected peak value is continuously renewed or varied. Then, after the alternating voltage signal Vs reaches a peak voltage Vp, this peak voltage Vp is held.

Thus, by using the peak hold circuit 12, the peak voltage Vp can be accurately detected. This peak voltage Vp is held until the peak hold circuit 12 receives the next reset signal Re outputted during the time period when the alternating voltage signal Vs is going high. Thus, each time the peak hold circuit 12 receives the reset signal Re, the peak hold circuit 12 is reset, and therefore the peak voltage Vp is renewed per cycle of the alternating voltage signal Vs.

The sample-and-hold circuit 13 receives the output of the peak hold circuit 12. As described above, the outputting of the sampling instruction signal from the sampling instruction circuit 15 starts after one fourth ($\frac{1}{4}$) of the cycle of the alternating voltage signal Vs from its peak time Tp, and this sampling instruction signal is fed to the sample-and-hold circuit 13 via the OR circuit 19. Therefore, the peak voltage Vp held by the peak hold circuit 12 can be sampled by the sample-and-hold circuit 13. As described above, the outputting of the above sampling instruction signal is stopped before the next reset signal Re is outputted, so that the sample-and-hold circuit 13 is switched from a sampling mode to a hold mode. Therefore, the sampled peak voltage Vp can be positively held.

The output of the sample-and-hold circuit 13 is amplified by the amplifier circuit 14, and then is converted into a digital signal by an analog-to-digital (A/D) converter 20, and then is fed to the microcomputer 5. The output of the sample-and-hold circuit 13 accurately represents the peak voltage Vp of the alternating voltage signal Vs and therefore accurately represents the magnitude or value of the load L.

When the load L varies in value, this variation is represented by a variation of the peak voltage Vp of the alternating voltage signal Vs. This peak voltage Vp appears in the form of the output of the sample-and-hold circuit 13 with a very short time delay from the peak time Tp of the alternating voltage signal Vs, that is, after one fourth ($\frac{1}{4}$) of the cycle of the alternating voltage signal Vs from the peak time Tp thereof. Therefore, the microcomputer 5 can soon respond to the variation in the load L to control the amount of injection of the fuel, thereby properly restraining the instantaneous variation in the output frequency of the generator 1.

When a power switch (not shown) connected in series with the load L is turned off to de-energize the load L, or when the waveform voltage signal generating circuit 9 is subjected to malfunction, the alternating voltage signal Vs ceases to be inputted into the peak voltage detecting circuit 10. At this time, as described above, the detection signal St of a high level is continuously outputted from the detection circuit 17 a predetermined period of time after the inputting of the alternating voltage signal Vs stops. The peak hold circuit 12 is responsive to this detection signal St to be reset, so that the output of the peak hold circuit 12 is stably maintained at zero volt. The sample-and-hold circuit 13 is responsive to the detection signal St to be switched into its sampling mode, so that the circuit 13 continuously effects the sampling of the output of zero volt from the peak hold circuit 12. As a result, the output of the sample-and-hold circuit 13 is maintained at zero volt, so that the microcomputer 5 can positively know that the load L is zero.

FIGS. 6 to 8 show a modified form of the invention. In this embodiment, those parts corresponding those of the preceding embodiment of FIGS. 1 to 5 are denoted by identical reference numerals or characters, respectively, and will not be described further. In this embodiment, as shown in FIG. 6, a peak voltage detecting means 10' comprises a peak hold circuit 12 and an output buffer circuit 22, and other necessary functions are performed by a microcomputer 5. One pulse signal Ps per cycle of the alternating voltage signal Vs is inputted into the microcomputer 5 from the rotation detecting device 4 (FIG. 1). The pulse signal Ps is inputted into the microcomputer 5 at a specified point in time after the time of the peak of the alternating voltage signal Vs, and preferably at such a specified point during time period when the alternating voltage signal Vs has a negative polarity.

The microcomputer 5 is responsive to the pulse signal Ps to execute an interrupt routine as shown in FIG. 7. Referring to this interrupt routine, first, in Step 100, the peak voltage held by the peak hold circuit 12 is inputted into the microcomputer 5. The thus inputted peak voltage is written onto a location of a random access memory (RAM) or is loaded onto a register. In the next Step 101, a reset signal Re is fed to the peak hold circuit 12 to reset the same. Thus, as shown in FIG. 8, when the pulse signal Ps is inputted into the microcomputer 5 a short time after the time of the peak of the alternating voltage signal Vs, the peak voltage (i.e., load information) to be stored in the microcomputer 5 is renewed.

As is clear from the foregoing description, in this embodiment, Step 100 constitutes a sample-and-hold means, and Step 101 constitutes a reset means, and the rotation detecting device 4 constitutes a sample hold instruction means. By amplifying the function of the microcomputer 5 in this manner, the circuitry of the load detecting system can be simplified.

In this embodiment of FIGS. 6 to 8, the rotation detecting device 4 may be of the type designed to generate a number of pulses per cycle of the alternating voltage signal, in which case this pulse signal is subjected to frequency dividing to produce a sample hold instruction signal.

While the invention has been specifically shown and described herein, the invention itself is not to be restricted to the exact showing of the drawings and the description thereof, and many modifications may be made without departing from the spirit of the invention. For example, the alternating voltage signal may be subjected to full-wave rectification to produce a waveform voltage signal.

What is claimed is:

1. A system for detecting a load on a generator, comprising:
   (a) means for generating a waveform voltage signal from an alternating current passing through the load connected to the generator, said waveform voltage signal corresponding to the magnitude of the load;
   (b) peak hold means for detecting a peak voltage of said waveform voltage signal and for holding said peak voltage;
   (c) reset means for outputting a reset signal to said peak hold means to reset the same during a time period between a point after the peak of said waveform voltage signal and a point before a subsequent peak of said waveform voltage signal;
   (d) sampling instruction means for outputting a sampling instruction signal during a time period between the point after the peak of said waveform voltage signal and a point before said peak hold means is reset by said reset signal; and
   (e) sample-and-hold means responsive to said sampling instruction signal so as to operate in a sampling mode to sample the peak voltage outputted from said peak hold means, said sample-and-hold means being kept in a hold mode to hold the sampled peak voltage when said sampling instruction signal ceases to be fed to said sample-and-hold means.

2. A system according to claim 1, in which said sampling instruction means comprises a waveform shaping circuit for converting said waveform voltage signal into a rectangular wave in the form of a binary logic signal, those portions of one of the two levels of said rectangular wave being used as said sampling instruction signal.

3. A system according to claim 2, in which said waveform voltage signal generating means outputs said waveform voltage signal in the form of an alternating voltage signal, said rectangular wave being changed in logic level substantially at points where said alternating voltage signal crosses its zero axis whereby said sampling instruction signal is outputted during a half of the cycle of said alternating voltage signal between a point delayed ¼ of said cycle from the time of the peak voltage of said alternating voltage signal and a point delayed from ¾ of said cycle from the time of the peak voltage of said alternating voltage signal, thereby rendering said sample-and-hold means to operate in the sampling mode, said sampling instruction means ceasing to output said sampling instruction signal during the other half of the cycle of said alternating voltage signal, thereby rendering said sample-and-hold means to operate in the hold mode.

4. A system according to claim 2, in which said reset means includes a differentiating circuit for differentiating said rectangular wave outputted from said waveform shaping circuit, the output of said differentiating circuit being used as said reset signal, so that said reset signal is outputted immediately after the outputting of said sampling instruction signal is stopped.

5. A system according to claim 1, further comprising detection means for detecting the stop of the outputting of said waveform voltage signal from said waveform voltage signal generating means to output a detection signal, said detection signal being fed as said reset signal to said peak hold means, said detection signal also being fed as said sampling instruction signal to said sample-and-hold means.

6. A system according to claim 5, in which said sampling instruction means includes a waveform shaping circuit for converting said waveform voltage signal into a rectangular wave in the form of a binary logic signal, those portions of one of the two levels of said rectangular wave being used as said sampling instruction signal, said detection means including an integrating circuit for integrating said rectangular wave, and a comparator circuit for comparing the output of said integrating circuit with a predetermined reference level and for continuously outputting said detection signal when the output of said integrating circuit is below said predetermined reference level.

7. A system according to claim 1, in which said sampling instruction means includes a rotation detecting means for outputting a pulse signal in accordance with the rotation of the generator, said pulse signal being outputted at a point other than the time of the peak of said waveform voltage signal so as to be used as said sampling instruction signal.

8. A system according to claim 7, further comprising a microcomputer, said microcomputer being responsive to said pulse signal to store in an associated memory the peak voltage from said peak hold means and subsequently to output said reset signal to said peak hold means, whereby said microcomputer substantially performs the functions of said sample-and-hold means and said reset means.

9. A system according to claim 1, in which said waveform voltage signal generating means includes a transformer, a primary winding of said transformer being connected in series with the load, an alternating voltage signal being produced at a secondary winding of said transformer, and said alternating voltage signal being used as said waveform voltage signal.

* * * * *